United States Patent [19]
Walker

[11] Patent Number: 5,855,489
[45] Date of Patent: Jan. 5, 1999

[54] LOW PROFILE ACTUATOR FOR ZIF SOCKET

[75] Inventor: Kevin Eugene Walker, Hershey, Pa.

[73] Assignee: The Whitaker Corporation, Wilmington, Del.

[21] Appl. No.: 854,310

[22] Filed: May 12, 1997

[51] Int. Cl.$^6$ .................................................. H01R 4/50
[52] U.S. Cl. ............................................................. 439/342
[58] Field of Search ................................... 439/342, 259, 439/266, 269.1, 73, 263, 264

[56] References Cited

U.S. PATENT DOCUMENTS

| | | | |
|---|---|---|---|
| 4,420,205 | 12/1983 | Kirkman | 439/342 |
| 4,538,870 | 9/1985 | Thewlis | 439/342 |
| 4,950,980 | 8/1990 | Pfaff | 439/342 |
| 5,489,217 | 2/1996 | Scheitz et al. | 439/342 |
| 5,707,247 | 1/1998 | Ronstad | 439/342 |

OTHER PUBLICATIONS

AMP–Latch Ribbon Cable Connectors, Catalog 82012, Revised 8–95, pp. 9–13.

Primary Examiner—Hien Vu
Attorney, Agent, or Firm—Robert Kapalka

[57] ABSTRACT

A zero insertion force socket for an electronic package comprises a cover (20) which is slidably mounted on a base (10). The cover has a package mounting surface (22) which defines a plane. A cam mechanism (30) which is operable for sliding the cover on the base is pivotable on an axis (36) that extends perpendicular to the plane of the package mounting surface.

2 Claims, 3 Drawing Sheets

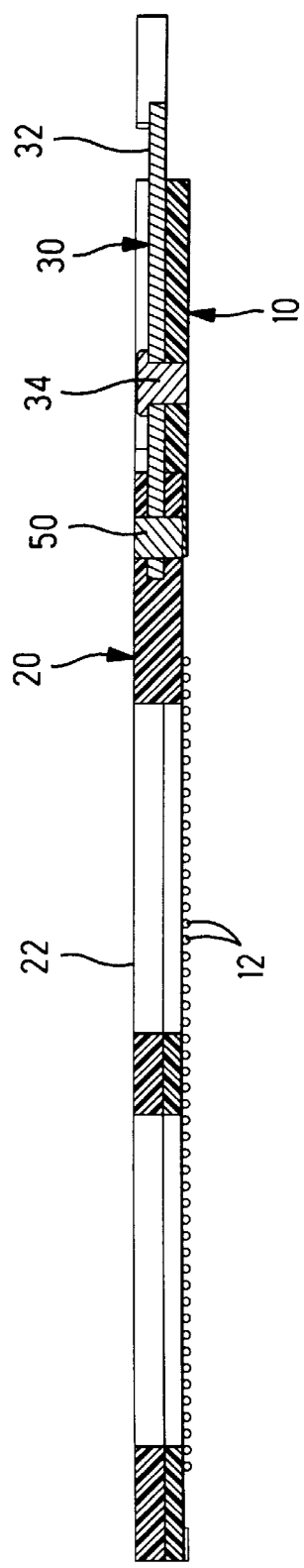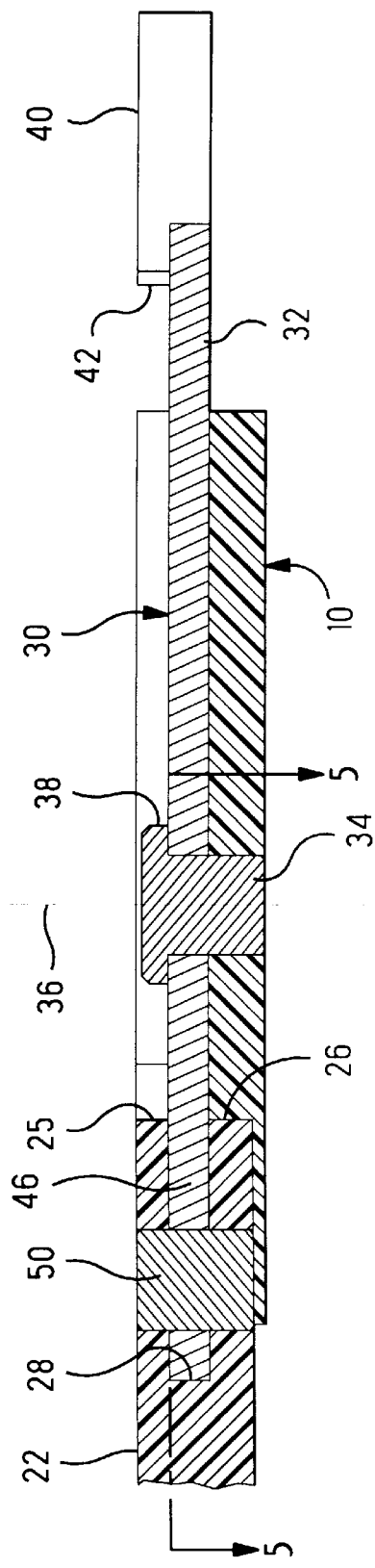

LOW PROFILE ACTUATOR FOR ZIF SOCKET

FIELD OF THE INVENTION

The invention relates to a zero insertion force (ZIF) socket having a cover which is slidable on a base.

BACKGROUND OF THE INVENTION

A zero insertion force socket for a pin grid array or ball grid array electronic package or the like typically includes a base, a cover and a cam actuator. The base holds an array of contacts in respective cavities, the contacts being matable with a corresponding array of leads on the electronic package. The cover is slidable over the base between open and closed positions. When the cover is in the open position the leads can be freely inserted into the cavities, and when the cover is in the closed position the leads are electrically mated with their respective contacts. The cam actuator is operable to move the cover over the base between the open and closed positions. Previous cam actuators such as that disclosed in U.S. Pat. No. 5,489,217 include a lever arm which is connected to rotate a cam on a horizontal axis. The cam is mounted in a tunnel between the base and the cover, and a portion of the cover over the tunnel is relatively tall compared to the remainder of the cover. Space limitations in modern electronic assemblies, particularly laptop computers, are continually being reduced. A problem with the prior art ZIF sockets is that the cam actuator is too high. There is a need to reduce the height of the cam actuator in a zero insertion force socket.

SUMMARY OF THE INVENTION

The invention is a socket for an electronic package comprising a base holding a plurality of contacts, a cover slidably mounted on the base, the cover having a package mounting surface defining a plane, and a cam mechanism which is pivotable on an axis perpendicular to the plane and operable for sliding the cover on the base.

In one embodiment, the cam mechanism includes a cam plate pivotally connected to the base. The cam plate has a slot and an inner edge of the cam plate along one side of the slot defines a first cam surface that is operably connected for moving the cover in a first direction. The cam plate has an outer edge which defines a second cam surface that is operably connected for moving the cover in a second direction.

BRIEF DESCRIPTION OF THE DRAWINGS

The invention will now be described by way of example with reference to the accompanying drawings wherein:

FIG. 3 is a cross-sectional view of the socket taken along line 3—3 in FIG. 1;

FIG. 4 is an enlarged view of a portion of FIG. 3 showing details of a cam mechanism in the socket;

DETAILED DESCRIPTION OF AN EMBODIMENT OF THE INVENTION

Figure 1:
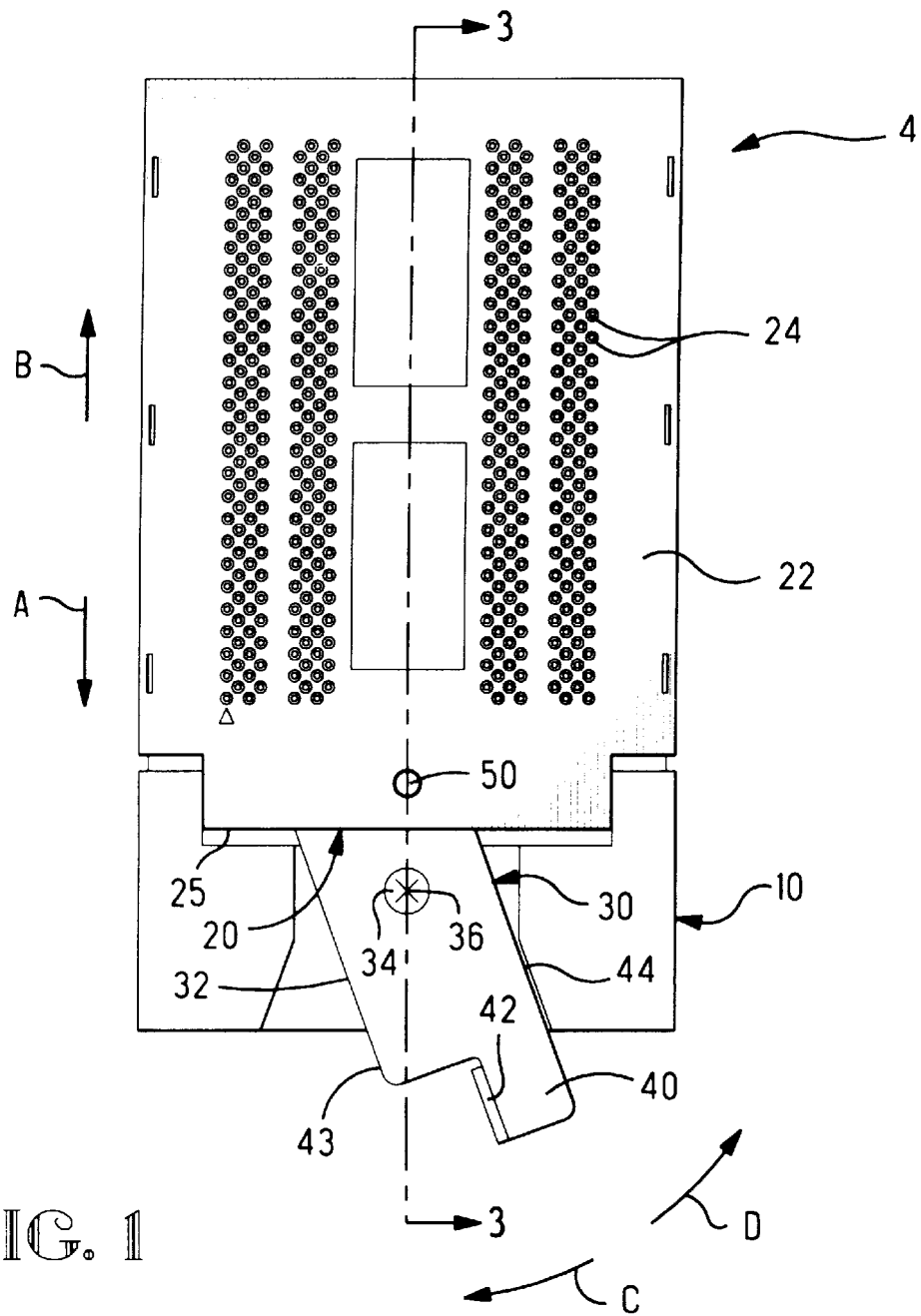
FIG. 1 is a top view of a socket according to the invention.
Figure 2:
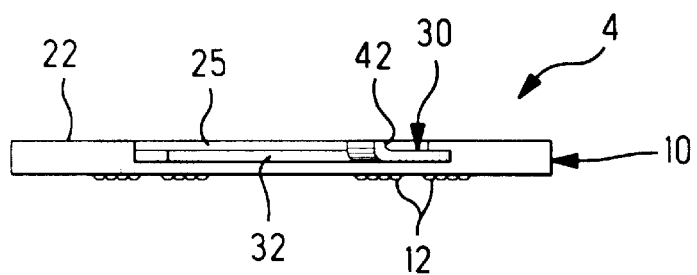
FIG. 2 is a side view of the socket.

There is shown in FIGS. 1–3 a zero insertion force socket 4 which can receive an electronic package (not shown) of the type which has an array of leads depending from a bottom surface thereof. The socket includes a base 10, a cover 20 and a cam mechanism 30. The base and the cover are each made from a dielectric material. The base holds a plurality of contacts in respective cavities (not shown), and the contacts are arranged in an array corresponding to the array of leads of the electronic package. The contacts have respective lead portions 12 extending below a bottom surface of the base for engagement with circuit traces on a circuit board or other substrate (not shown). The lead portions 12 are illustrated as solder balls which can be permanently attached to the traces on the circuit board in a solder reflow process. However, it should be understood that the lead portions 12 may have various other forms which are compatible with either through-hole or surface mount attachment.

The cover 20 is slidably mounted on the base 10 and is translatable over a top surface of the base between open and closed positions. The cover 20 has a package mounting surface 22 which defines a plane, and a plurality of apertures 24 which open through the package mounting surface and extend through the cover in registration with the plurality of cavities in the base. When the cover is in the open position, the leads of the electronic package are freely insertable through the apertures in the cover and into their respective cavities in the base. Moving the cover to the closed position moves the leads of the electronic package into electrical engagement with their respective contacts. Conversely, moving the cover again to the open position disengages the leads from the contacts and permits free withdrawal of the electronic package from the socket. More complete details of the structure and operation of a zero insertion force socket having a cover which is movable on a base are disclosed in U.S. Pat. No. 5,256,080 which is incorporated by reference as if set forth fully herein.

The cam mechanism 30 provides a means for sliding the cover over the base between the open and closed positions. With reference also to FIG. 4, the cam mechanism comprises a flat cam plate 32 which is pivotably mounted on a pivot pin 34 that is secured in the base 10 with an axis 36 of the pivot pin extending perpendicular to the plane of the package mounting surface 22. The pivot pin 34 has an enlarged head 38 which keeps the cam plate 32 secured to the base. The cam plate is preferably stamped from sheet material and may be formed with a handle portion 40 and an upturned edge 42 to provide a grip for finger actuation, as best seen in FIGS. 1 and 2. Alternatively, the cam plate may be actuated with a tool such as a spanner wrench which is configured to straddle the cam plate along respective opposite sides 43, 44.

Figure 5:
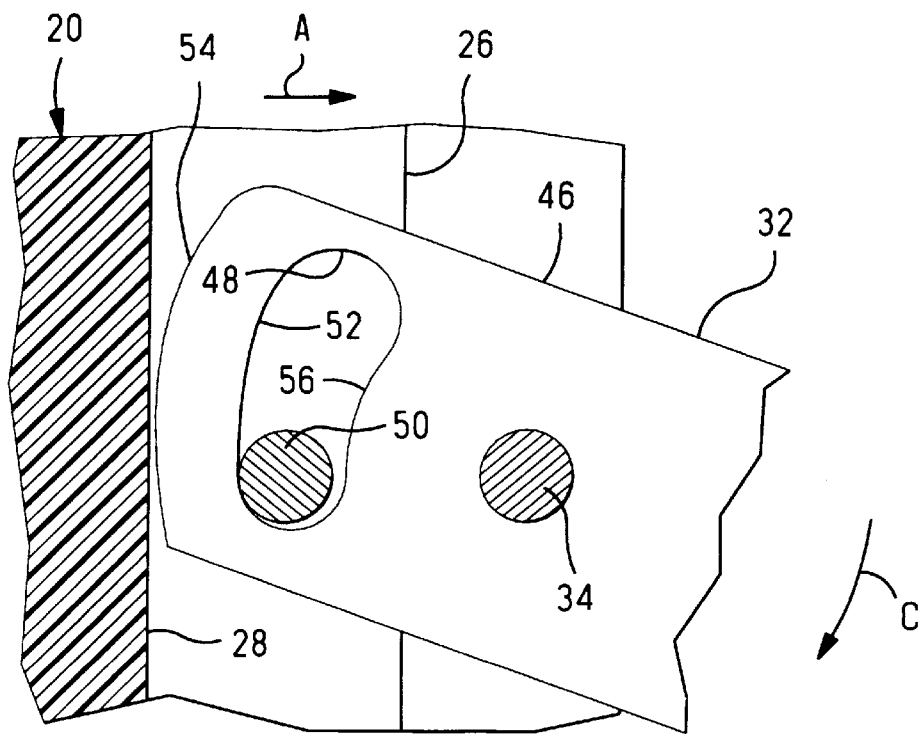
Fig. 5 is a view taken along line 5—5 in FIG. 4 showing the cam mechanism in one position.
Figure 6:
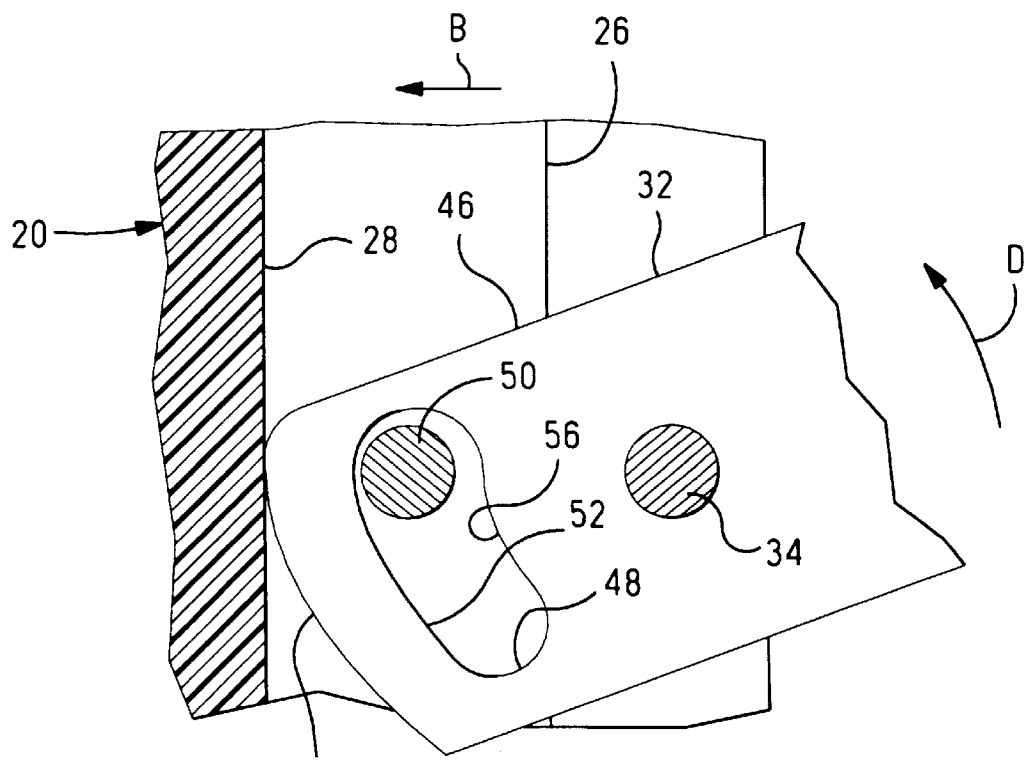
FIG. 6 is a view similar to FIG. 5 showing the cam mechanism in a different position.

Referring now to FIGS. 4–6, a front portion 46 of the cam plate 32 is trapped between upper and lower ledges 25, 26 of the cover such that the ledges form a clevis around the front portion 46. The cam plate has an elongated slot 48 which receives a follower pin 50 that is secured in the ledges of the cover. An inner edge 52 of the cam plate along one side of the slot defines a first cam surface that is operable on the follower pin 50 to move the cover 20 in a first direction A when the cam plate is pivoted clockwise as shown by arrow C. Another edge of the cam plate defines a second cam surface that is operably connected to move the cover in a second direction B when the cam plate is pivoted counterclockwise as shown by arrow D. The second cam surface may be defined on a front outer edge 54 of the cam plate that is operable on surface 28 of the cover that extends between the ledges 24, 26. Alternatively, the second cam surface may be defined by an inner edge 56 of the cam plate which is a side of the slot opposite from the edge 52 that defines the first cam surface.

It should be noted that the cam plate 32 is disposed relatively below the package mounting surface 22 during a full range of its pivoting motion.

The invention provides a zero insertion force socket with a cam mechanism that does not add any additional height to the socket. Thus, a socket according to the invention can be made with a very low profile.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

I claim:

1. A socket for an electronic package comprising:

a base holding a plurality of contacts;

a cover slidably mounted on the base, the cover having a package mounting surface defining a plane; and a cam mechanism which is operable for sliding the cover on the base, the cam mechanism including a cam plate which is connected by a pivot member to the base on an axis extending perpendicular to the plane, the cam plate having a slot and an inner edge of the cam plate along one side of the slot defines a first cam surface that is operably connected for moving the cover in a first direction, the cam plate having an outer edge which defines a second cam surface that is operably connected for moving the cover in a second direction.

2. The socket according to claim 1, wherein the cam plate is disposed relatively below the package mounting surface during a full range of pivoting motion.

* * * * *